(12) United States Patent
Kobayashi et al.

(10) Patent No.: US 10,128,139 B2
(45) Date of Patent: Nov. 13, 2018

(54) SUBSTRATE HOLDING METHOD AND SUBSTRATE PROCESSING APPARATUS

(71) Applicant: SCREEN Holdings Co., Ltd., Kyoto (JP)

(72) Inventors: Kazutaka Kobayashi, Kyoto (JP); Hiroshi Kato, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 166 days.

(21) Appl. No.: 15/080,627

(22) Filed: Mar. 25, 2016

(65) Prior Publication Data

US 2016/0284585 A1 Sep. 29, 2016

(30) Foreign Application Priority Data

Mar. 27, 2015 (JP) .................................. 2015-066241
Jan. 25, 2016 (JP) .................................. 2016-011694

(51) Int. Cl.
*H01L 21/677* (2006.01)
*H01L 21/67* (2006.01)
*H01L 21/687* (2006.01)

(52) U.S. Cl.
CPC .. *H01L 21/67742* (2013.01); *H01L 21/67051* (2013.01); *H01L 21/67748* (2013.01); *H01L 21/68728* (2013.01)

(58) Field of Classification Search
CPC ......... H01L 21/67742; H01L 21/67748; H01L 21/68728
See application file for complete search history.

(56) References Cited

U.S. PATENT DOCUMENTS

| | | | | |
|---|---|---|---|---|
| 5,601,645 A | * | 2/1997 | Nonomura | ............... B05C 11/08 |
| | | | | 118/500 |
| 8,262,799 B2 | | 9/2012 | Nishide | ......................... 118/730 |
| 2016/0096205 A1 | | 4/2016 | Kato | ............................. 134/157 |

FOREIGN PATENT DOCUMENTS

| | | |
|---|---|---|
| CN | 102034725 B | 1/2013 |
| JP | 10-209249 | 8/1998 |
| JP | 2004-241492 | 8/2004 |
| JP | 2005-142585 A | 6/2005 |
| JP | 4095613 B | 6/2008 |
| JP | 2014-022419 | 2/2014 |
| JP | 2014-045028 | 3/2014 |
| WO | WO 2014/203587 A1 | 12/2014 |

OTHER PUBLICATIONS

Korean Office Action dated Aug. 11, 2017 in connection with Korean Patent Application No. 10-2016-0035910. (Not included).

* cited by examiner

*Primary Examiner* — Kaitlin S Joerger
(74) *Attorney, Agent, or Firm* — Ostrolenk Faber LLP

(57) ABSTRACT

A substrate holding method is to horizontally hold a substrate, and includes a positioning step of positioning a substrate by moving a substrate transfer mechanism and by allowing the peripheral edge of the substrate to come into contact with the plurality of positioning pins, a substrate grasping step of bringing the plurality of grasping pins into a closed state after completing the positioning step so that the substrate held by the plurality of positioning pins and the plurality of grasping pins, and a transfer mechanism receding step of allowing the substrate transfer mechanism to recede from above the spin base after completing the substrate grasping step.

7 Claims, 8 Drawing Sheets

SUBSTRATE HOLDING METHOD AND SUBSTRATE PROCESSING APPARATUS

BACKGROUND OF THE INVENTION

1. Field of the Invention

The present invention relates to a method for allowing a substrate holding/rotating device that has a spin base to hold a substrate, and relates to a substrate processing apparatus that includes this substrate holding/rotating device and a substrate transfer mechanism. Examples of substrates to be processed include semiconductor wafers, glass substrates for liquid crystal display devices, glass substrates for plasma displays, substrates for photomasks, substrates for optical disks, substrates for magnetic disks, substrates for magnet-optical disks, substrates for FEDs (Field Emission Displays), ceramic substrates, and substrates for solar cells.

2. Description of Related Art

A substrate processing apparatus that processes substrates, such as semiconductor wafers, is roughly divided into a batch type processing apparatus that processes a plurality of substrates in one operation and a single substrate processing type apparatus that processes to-be-processed substrates in a processing chamber one by one at a time. In a generally-used single substrate processing type apparatus, a single substrate is horizontally held in a processing chamber, and is rotated or is supplied with a processing liquid in accordance with the contents of processing.

The single substrate processing type apparatus includes a spin chuck. A plurality of chuck pins are evenly spaced in a circumferential direction on the upper surface of a spin base of the spin chuck. Each chuck pin is disposed so as to be switchable between two kinds of operational states, i.e., between a closed state in which contact is made with the peripheral edge of a substrate and an open state in which contact is not made with the peripheral edge of a substrate. The substrate is held by the spin chuck by sandwiching the substrate between the chuck pins in a horizontal direction.

The substrate is held by the spin chuck as a result of a cooperative operation between the chuck pin and a horizontal support pin. One example of a substrate holding operation performed by the spin chuck is disclosed by Japanese Patent Application Publication No. 2014-45028. In Japanese Patent Application Publication No. 2014-45028, a spin chuck in a substrate processing apparatus is composed of a disk-shaped spin base, a plurality of holding bases spaced along a circumference corresponding to the outer peripheral shape of a substrate in the peripheral edge of the upper surface of the spin base, and a spin motor that rotates the spin base around a vertical rotational axis passing through the center of the spin base. The holding base includes a horizontal support pin that supports the substrate from below from its undersurface and chuck pins that sandwich the substrate therebetween from the direction of the side of the substrate.

SUMMARY OF THE INVENTION

However, in Japanese Patent Application Publication No. 2014-45028, an operation to support a lower portion of the substrate from below by means of the horizontal support pin is required to sandwich the substrate between the support pins from its side surface. Therefore, the horizontal support pins and a mechanism to move these pins are needed, thus making it difficult to reduce the substrate processing apparatus in size. Also, a step of placing the lower portion of the substrate at the horizontal support pins before sandwiching the substrate therebetween is indispensable, and therefore it is difficult to perform steps ranging from the transfer of the substrate to the sandwich of the substrate from its side surface in a short time.

A desire has been held to sandwich a substrate from a horizontal direction by means of a simple arrangement in allowing a substrate holding/rotating mechanism (spin chuck) to hold the substrate without providing the horizontal support pins and the moving mechanism.

Therefore, it is an object of the present invention to provide a substrate holding method and a substrate processing apparatus capable of sandwiching a substrate from a horizontal direction by means of a simple arrangement while securing high positioning accuracy in allowing a substrate holding/rotating mechanism to hold the substrate.

According to a first aspect of the present invention, a substrate holding method for horizontally holding a substrate is provided, and the substrate holding method includes a placing step of placing a substrate on a substrate transfer mechanism, a first preparation step of bringing a plurality of positioning pins disposed along a circumferential direction into a closed state in a first area of a peripheral edge of an upper surface of a spin base, a second preparation step of bringing a plurality of grasping pins disposed along the circumferential direction into an open state in a second area that does not coincide with the first area in the circumferential direction in the peripheral edge of the upper surface of the spin base, a positioning step of positioning the substrate by moving the substrate transfer mechanism after completing the placing step, the first preparation step, and the second preparation step and by allowing the peripheral edge of the substrate to come into contact with the plurality of positioning pins, a substrate grasping step of bringing the plurality of grasping pins into a closed state after completing the positioning step so that the substrate held by the plurality of positioning pins and the plurality of grasping pins, and a transfer mechanism receding step of allowing the substrate transfer mechanism to recede from above the spin base after completing the substrate grasping step.

According to this method, it is possible to omit a step of temporarily placing a substrate on a horizontal support pin or the like from the substrate transfer mechanism. Also, the positioning pin is beforehand brought into a closed state, and the position of the positioning pin in this closed state serves as a positioning standard of the substrate with respect to the spin base, and therefore it is possible to secure positioning accuracy. That is, it is possible to reduce the number of steps while securing substrate-positioning accuracy when the substrate is held by the spin chuck.

Also, in one preferred embodiment of the present invention, the positioning pins are disposed in the first area within a distribution angle of 180 degrees.

If the distribution angle of the positioning pins exceeds 180 degrees, it is substantially difficult to bring the substrate into contact with the positioning pins regardless of whether the grasping pin is in an open state or in a closed state because the positioning pin is in a closed state. Therefore, it is possible to avoid such a problem by an arrangement in which the positioning pins are disposed in a range within a distribution angle of 180 degrees as in the present method.

Also, the positioning pins may be always kept in a closed state during the second preparation step, the positioning step, the substrate grasping step, and the transfer mechanism receding step.

According to this method, if the positioning pin is arranged to be capable of being opened or closed between an open state and a closed state, it is possible to exclude a step of changing the open state or the closed state of the positioning pin.

According to a second aspect of the present invention, a substrate processing apparatus for processing a substrate is provided, and the substrate processing apparatus includes a substrate holding/rotating device that horizontally holding and rotating a substrate and a substrate transfer mechanism that transfers the substrate, and the substrate holding/rotating device includes a spin base that is rotatable on a rotational axis, a rotation driving mechanism that rotates the spin base, a plurality of positioning pins disposed along a circumferential direction in a first area of a peripheral edge of an upper surface of the spin base, a plurality of grasping pins disposed along the circumferential direction in a second area that does not coincide with the first area in the circumferential direction of the peripheral edge of the upper surface of the spin base, a grasping pin opening/closing mechanism that allows the plurality of grasping pins to perform switching between a closed state and an open state, and a control unit that controls an operation of the substrate transfer mechanism, an operation of the rotation driving mechanism, and an operation of the grasping pin opening/closing mechanism.

According to this arrangement, it is possible to omit mechanism such as a horizontal support pin to temporarily place a substrate from the arrangement of the substrate holding/rotating device. Additionally, the positioning pin is beforehand brought into a closed state, and the position of the positioning pin in this closed state serves as a positioning standard of the substrate with respect to the spin base, and therefore it is possible to secure positioning accuracy. That is, it is possible to reduce a mechanism such as the horizontal support pin while securing substrate-positioning accuracy when the substrate is held by the spin chuck.

Also, in one preferred embodiment of the present invention, the positioning pins are disposed in the first area within a distribution angle of 180 degrees.

If the distribution angle of the positioning pins exceeds 180 degrees, it is substantially difficult to bring the substrate into contact with the positioning pins regardless of whether the grasping pin is in an open state or in a closed state because the positioning pin is in a closed state in the present invention. Therefore, it is possible to avoid such a problem by an arrangement in which the positioning pins are disposed in a range within a distribution angle of 180 degrees as in the present arrangement.

The plurality of positioning pins may be fixed to be always in a closed state. According to this arrangement, it is only necessary for the positioning pins to maintain the closed state, and therefore it is possible to exclude, for example, a mechanism that performs switching between an open state and a closed state.

The aforementioned or other objects, features, and effects of the present invention will be clarified by the following description of preferred embodiments with reference to the accompanying drawings.

DETAILED DESCRIPTION OF PREFERRED EMBODIMENTS

Figure 1:
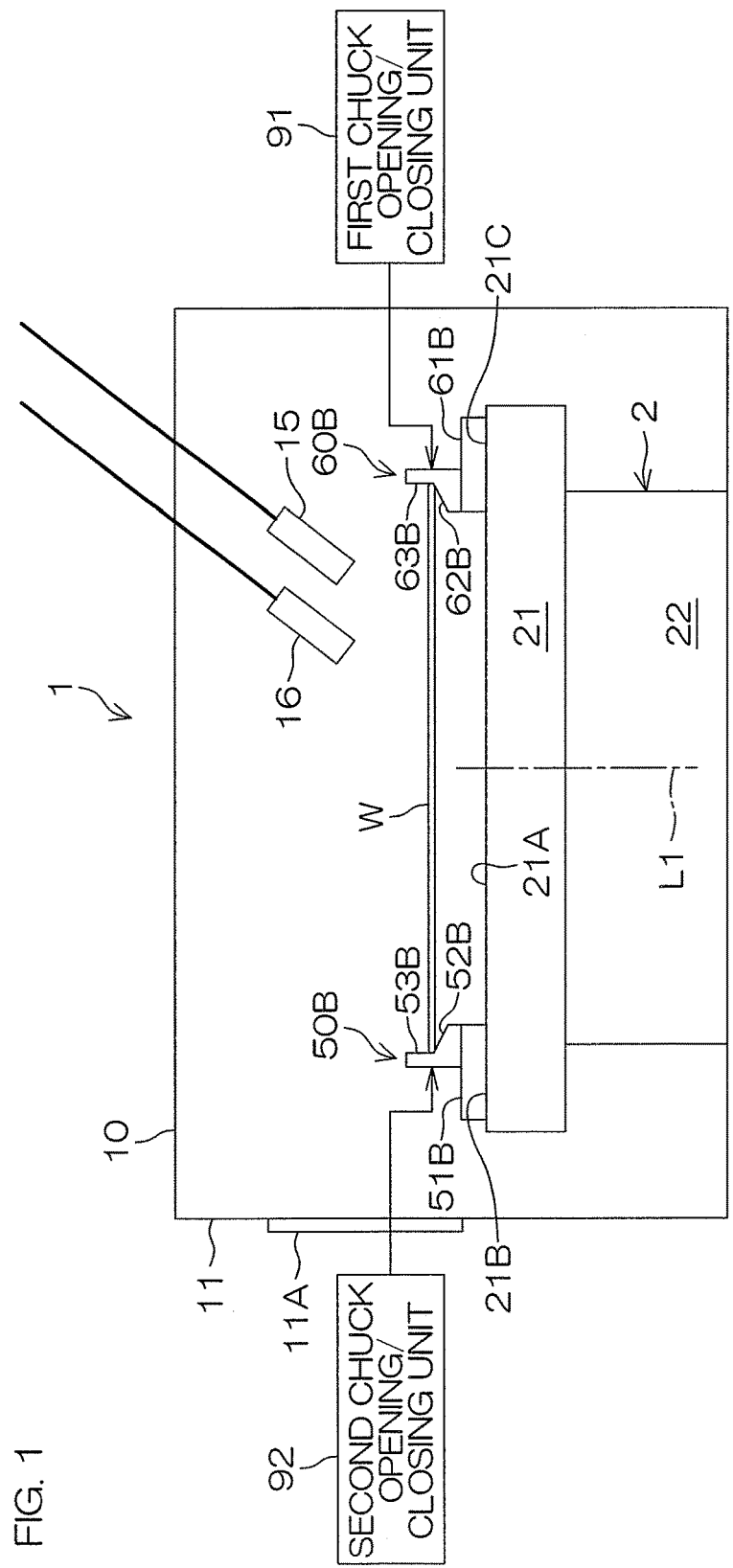
FIG. 1 is a view showing a schematic arrangement of a substrate processing apparatus according to a preferred embodiment of the present invention.
Figure 5:
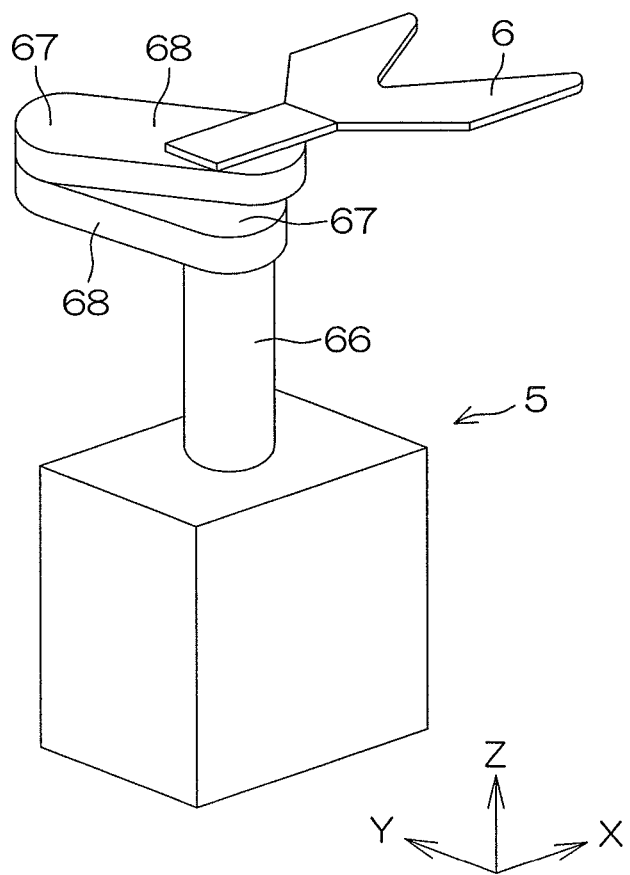
FIG. 5 is a schematic perspective view to describe an arrangement of a substrate transfer mechanism.

FIG. 1 is a side view showing a schematic arrangement of a substrate processing apparatus 1 according to a preferred embodiment of the present invention. The substrate processing apparatus 1 includes a processing chamber 10 surrounded by a chamber wall 11. The processing chamber 10 includes a spin chuck 2 (substrate holding/rotating device). A shutter portion 11A having an openable/closable opening is disposed at the side surface of the chamber wall 11. A hand mechanism 6 of a substrate transfer mechanism 5 shown in FIG. 5 is allowed to move back and forth through the opening.

The substrate processing apparatus 1 further includes a processing liquid nozzle 15 and/or a gas nozzle 16. The processing liquid nozzle 15 or the gas nozzle 16 is ordinarily in a retreated state at a retreat position except when substrates are processed, and is moved by a moving mechanism (not shown) to a predetermined position above a substrate W when substrates are processed.

The spin chuck 2 is composed of a disk-shaped spin base 21 and a spin motor 22 (rotation driving mechanism) that rotates the spin base 21. The spin motor 22 is disposed below the spin base 21. A plurality of positioning-pin base portions 51A, 51B, and 51C are approximately equally spaced along a circumferential direction at the peripheral edge of the upper surface of the spin base 21. The positioning-pin base portions 51A, 51B, and 51C are disposed in a first area 21B (see FIG. 2A) that is defined as a range of about 120 degrees (predetermined angle within 180 degrees) of the peripheral edge of the upper surface of the spin base 21. In other words, the positioning-pin base portions 51A, 51B, and 51C are disposed with intervals of about 60 degrees therebetween. Still in other words, the distribution angle of the positioning-pin base portions 51A, 51B, and 51C (positioning pins 50A, 50B, and 50C described as follows) is about 120 degrees (predetermined angle within 180 degrees).

The positioning pins 50A, 50B, and 50C are disposed on upper parts of the positioning-pin base portions 51A, 51B, and 51C, respectively, so as to be movable (or rotatable) in a radial direction with respect to the positioning-pin base portions 51A, 51B, and 51C. A first chuck opening/closing unit 91 is connected to each of the positioning pins 50A, 50B, and 50C. Power sources of various types, such as a power source that uses an electric motor and a power source that uses electromagnets, are usable as the power source of the first chuck opening/closing unit 91. The positioning pins 50A, 50B, and 50C are moved by the first chuck opening/closing unit 91 between a contact position at which the pins come into contact with the peripheral edge of the substrate W and an open position away from a rotational axis L1 more than the contact position. A state in which the positioning pins 50A, 50B, and 50C are in the contact position is referred to as the closed position of the positioning pins 50A, 50B, and 50C, whereas a state in which the positioning pins 50A, 50B, and 50C are in the open position is referred to as the open position of the positioning pins 50A, 50B, and 50C.

A plurality of grasping-pin base portions 61A, 61B, and 61C are approximately equally spaced along the circumferential direction at the peripheral edge of the upper surface of the spin base 21. The grasping-pin base portions 61A, 61B, and 61C are disposed in a second area 21C (see FIG. 2A) that is defined as a range of about 120 degrees (predetermined angle within 180 degrees) of the peripheral edge of the upper surface of the spin base 21. The second area 21C does not overlap with the first area 21B in the circumferential direction in the peripheral edge of the upper surface of the spin base 21.

In other words, the grasping-pin base portions 61A, 61B, and 61C are disposed with intervals of about 60 degrees therebetween. Still in other words, the distribution angle of the grasping-pin base portions 61A, 61B, and 61C (grasping pins 60A, 60B, and 60C described as follows) is about 120 degrees (predetermined angle within 180 degrees).

The grasping pins 60A, 60B, and 60C are disposed on upper parts of the grasping-pin base portions 61A, 61B, and 61C, respectively, so as to be movable in the radial direction with respect to the grasping-pin base portions 61A, 61B, and 61C. A second chuck opening/closing unit (grasping-pin opening/closing mechanism) 92 is connected to each of the grasping pins 60A, 60B, and 60C. Power sources of various types, such as a power source that uses an electric motor and a power source that uses electromagnets, are usable as the power source of the second chuck opening/closing unit 92. The grasping pins 60A, 60B, and 60C are moved by the second chuck opening/closing unit 92 between a contact position at which the pins come into contact with the peripheral edge of the substrate W and an open position away from the rotational axis L1 more than the contact position. In the present preferred embodiment, the open position of the grasping pins 60A, 60B, and 60C is on the circumference centering the rotational axis L1 with the open position of the positioning pins 50A, 50B, and 50C. A state in which the grasping pins 60A, 60B, and 60C are in the contact position is referred to as the closed position of the grasping pins 60A, 60B, and 60C, whereas a state in which the grasping pins 60A, 60B, and 60C are in the open position is referred to as the open position of the grasping pins 60A, 60B, and 60C.

In FIG. 1, in order to facilitate the understanding of the drawing, the positioning-pin base portions, the positioning pins, the grasping-pin base portions, the grasping pins are not all shown, and only the elements consisting of the positioning pin 50B, the positioning-pin base portion 51B corresponding to this pin, the grasping pin 60B, and the grasping-pin base portion 61B corresponding to this pin are shown. The same omission as above is made in FIG. 4A to FIG. 4J described later.

The positioning pins 50A, 50B, and 50C respectively have contact portions 53A, 53B, and 53C each of which is formed cylindrically so as to come into contact with the peripheral edge (peripheral end surface) of a substrate W and each of which is shaped into a circular arc when viewed planarly and guide portions 52A, 52B, and 52C each of which extends in a diagonal direction toward the lower part of each of the contact portions 53A, 53B, and 53C. In the present preferred embodiment, the positioning pins 50A, 50B, and 50C are set so that each is always in a closed state with respect to the spin base 21 regardless of the processed state of the substrate W.

Each of the grasping pins 60A, 60B, and 60C is basically the same in shape as each of the positioning pins 50A, 50B, and 50C. In other words, the grasping pins 60A, 60B, and 60C respectively have contact portions 63A, 63B, and 63C each of which is formed cylindrically so as to come into contact with the peripheral edge (peripheral end surface) of a substrate W and each of which is shaped into a circular arc when viewed planarly and guide portions 62A, 62B, and 62C each of which extends in a diagonal direction toward the lower part of each of the contact portions in the same way as the positioning pins 50A, 50B, and 50C. The grasping pins 60A, 60B, and 60C are horizontally moved by a pin driving mechanism 64 in the radial direction to the upper surface of the spin base 21 on the grasping-pin base portions 61A, 61B, and 61O of the grasping pins 60A, 60B, and 60C. These pins are horizontally moved (or rotated) in the direction of an outer periphery side with respect to the upper surface of the spin base 21 in an open state and in the direction of a slightly inner periphery side with respect to the upper surface of the spin base 21 in a closed state.

Figure 2A:
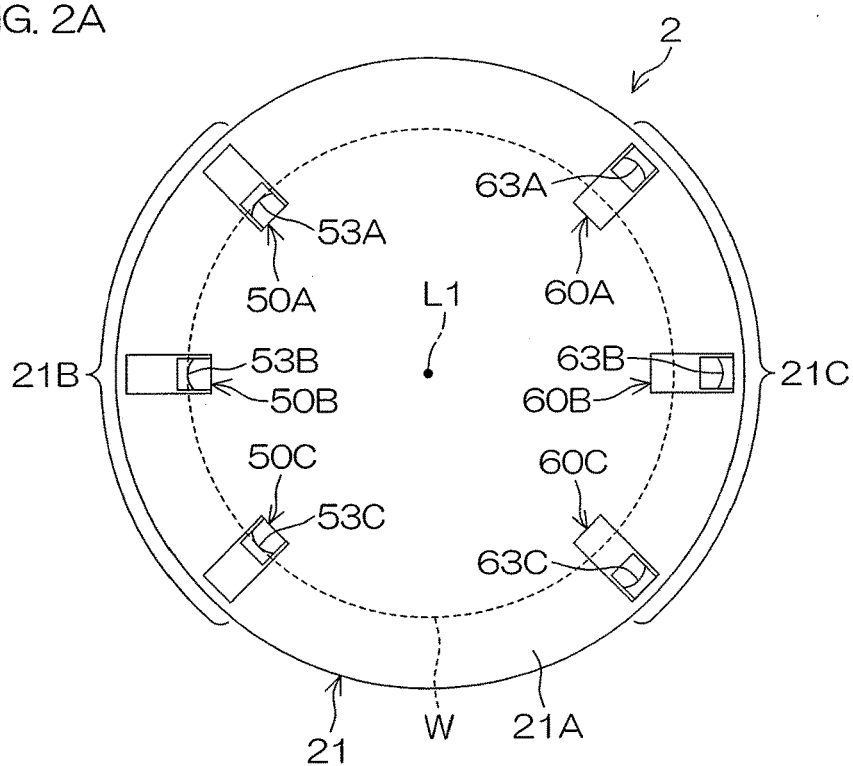
FIG. 2A is a plan view of a spin chuck in the substrate processing apparatus.
Figure 2B:
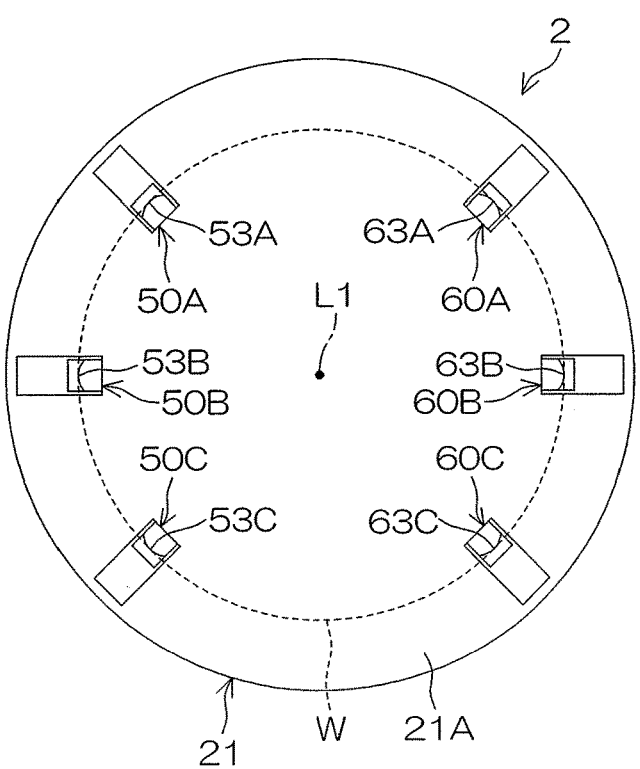
FIG. 2B is a plan view of the spin chuck in the substrate processing apparatus.

FIG. 2A and FIG. 2B are plan views of the spin chuck 2 in the substrate processing apparatus 1 according to one preferred embodiment of the present invention. In FIG. 2A, the positioning pins 50A, 50B, 50C are all in a closed state, whereas the grasping pins 60A, 60B, and 60C are all in an open state. In FIG. 2B, the positioning pins 50A, 50B, and 50C are all in a closed state, and the grasping pins 60A, 60B, and 60O are all in a closed state also. As thus described, the spin chuck 2 according to one preferred embodiment of the present invention has two kinds of pins in total, i.e., the positioning pins 50A, 50B, and 50C and the grasping pins 60A, 60B, and 60C, and, in a process in the present preferred embodiment, only the grasping pins 60A, 60B, and 60C are displaced to an open-state position and to a closed-state position.

Figure 3A:
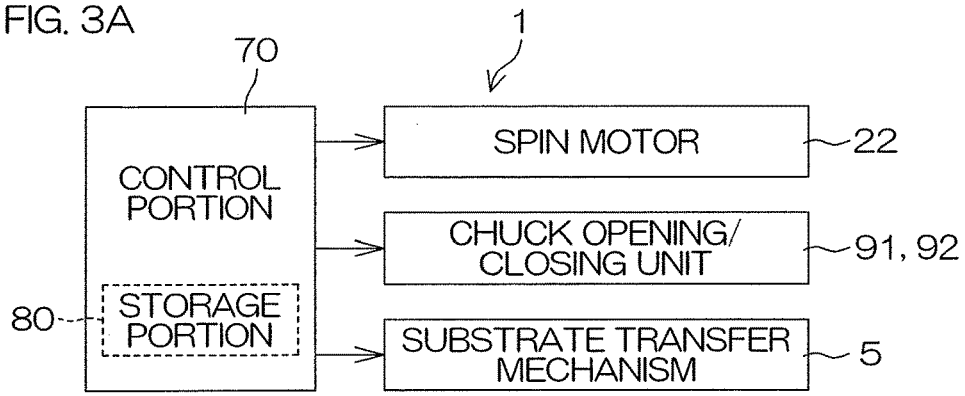
FIG. 3A is a block diagram to describe an electric arrangement of a main part of the substrate processing apparatus.

FIG. 3A is a block diagram to describe an electric arrangement of a main part of the substrate processing apparatus 1.

The substrate processing apparatus 1 includes a control portion (control unit) 70 that controls the operation of the substrate processing apparatus 1. The control portion 70 is arranged by use of, for example, a microcomputer. The control portion 70 includes an arithmetic unit such as a CPU, a read-only memory device, a storage portion 80 such as a hard disk drive, and an input-output unit. A program executed by the arithmetic unit is stored in the storage unit.

The control portion 70 controls the operation of the spin motor 22, the operation of the first and second chuck opening/closing units 91 and 92, the operation of the substrate transfer mechanism 5, etc., in accordance with a predetermined program.

Figure 3B:
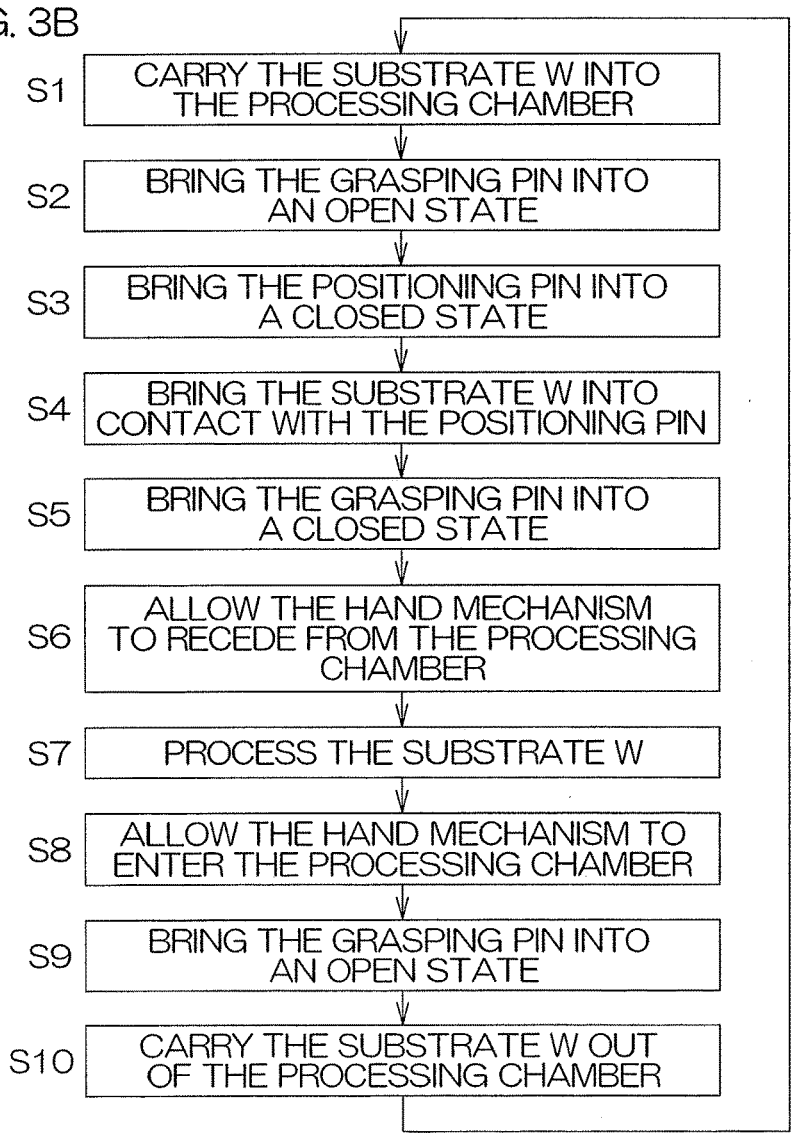
FIG. 3B is a flowchart showing the flow of a substrate carry-in/carry-out operation executed in the substrate processing apparatus.

FIG. 3B is a flowchart showing a process ranging from the carry-in of a substrate W into the processing chamber 10 to the carry-out of a substrate W from the processing chamber 10 with respect to the substrate processing apparatus 1 according to a preferred embodiment of the present invention. The process according to the preferred embodiment of the present invention will be hereinafter described with reference to FIG. 1 to FIG. 3B.

First, it will be described each of steps (S1 to S6) from the carry-in of a substrate W into the processing chamber 10 until a state in which various processing operations can be performed in the processing chamber.

Step S1

Figure 4A:
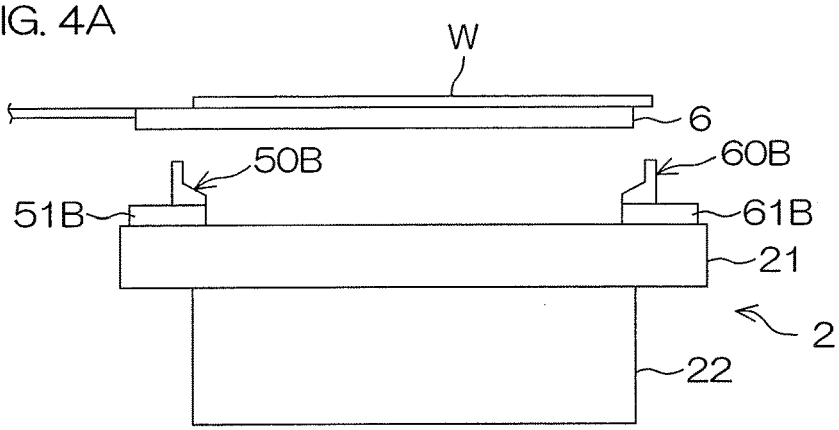
FIG. 4A is a view of the substrate processing apparatus to describe step S1 of the flowchart.

FIG. 4A is a side view of the spin chuck 2 to describe a relationship between the spin chuck 2 and a substrate W in step S1.

An apparatus arrangement of the substrate transfer mechanism 5 is shown in FIG. 5. The substrate transfer mechanism 5 is composed of an arm portion 68 that freely bends a joint portion 67 in a horizontal direction, a hand mechanism 6 that is connected to the arm portion 68 and that has its upper portion on which a substrate W is placed, and an up-and-down driving mechanism 66 that moves the joint portion 52, the arm portion 53, and the hand mechanism 6 upwardly and downwardly in a vertical direction. The control portion 70 (see FIG. 3A) moves the hand mechanism 6 in the vertical direction (i.e., perpendicular direction) while controlling the substrate transfer mechanism 5. The position of the hand mechanism 6 when these are moved is fixed by so-called teaching (instruction) by beforehand using a dummy wafer or the like, and is stored in the storage portion 80 (see FIG. 3A) as a series of processing-step parameters of the substrate processing apparatus 1.

The control portion 70 (see FIG. 3A) appropriately transmits a command of an appropriate position of the hand mechanism 6 from the storage portion 80 to the substrate transfer mechanism 5 in accordance with each step. In step S1, the substrate transfer mechanism 5 receives the substrate W from a loader/unloader portion (not shown) outside the processing chamber 10, and places the substrate W on the upper portion of the hand mechanism 6 (substrate placing step). In this state, the hand mechanism 6 is moved to a position above the spin chuck 2, and is stopped at a position at which the center of the substrate W placed thereon is slightly closer to the grasping pin 60B than the middle of the spin chuck 2 when viewed planarly.

Step S2

Figure 4B:
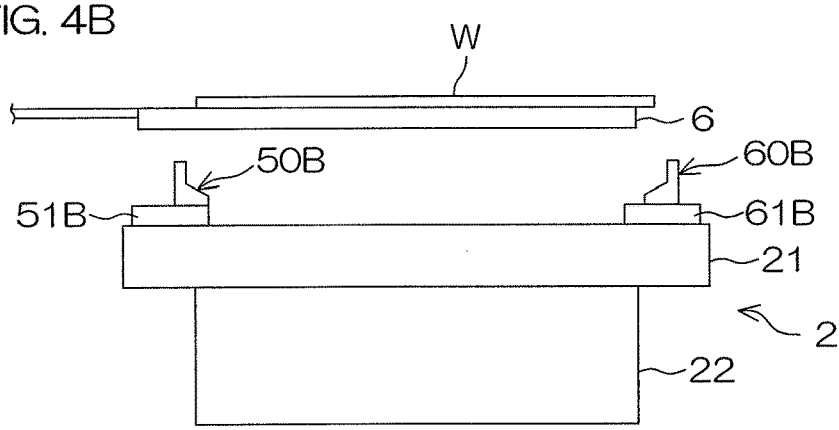
FIG. 4B is a view of the substrate processing apparatus to describe step S2 of the flowchart.

FIG. 4B is a side view of the spin chuck 2 to describe a relationship between the spin chuck 2 and a substrate W in step S2. In step S2, the grasping pins 60A, 60B, and 60C are all brought into an open state. In the substrate processing apparatus 1, if the substrate W has not been processed immediately before, an opening/closing sensor (not shown) examines whether the grasping pins 60A, 60B, 60C are on the outer periphery side in the radial direction of the spin base 21. If the grasping pins 60A, 60B, and 60C are on the inner periphery side in the radial direction of the spin base 21 (i.e., if the grasping pins 60A, 60B, and 60C are in a closed state), the control portion 70 controls the second chuck opening/closing unit 92, and brings the grasping pins 60A, 60B, and 60C into an open state (second preparation step). If the substrate W has been processed immediately before in the substrate processing apparatus 1, the grasping pins 60A, 60B, and 60C remain in the open state that is set when the preceding substrate W is carried out until a next substrate W is carried in after the preceding substrate W that has been processed is carried out, and therefore there is no need to bring those pins into an open state again.

Step S3

Figure 4C:
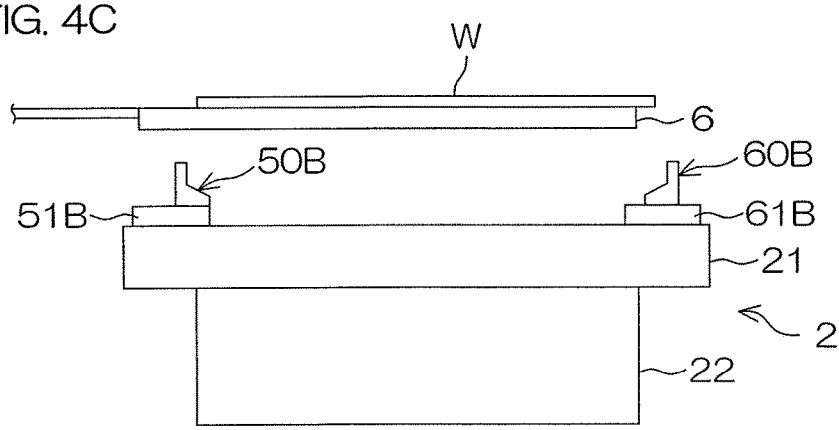
FIG. 4C is a view of the substrate processing apparatus to describe step S3 of the flowchart.

FIG. 4C is a side view of the spin chuck 2 to describe a relationship between the spin chuck 2 and a substrate W in step S3. In step S3, the control portion 70 controls the first chuck opening/closing unit 91, and brings the positioning pins 50A, 50B, and 50C into a closed state (first preparation step). The position of the positioning pins 50A, 50B, and 50C in the closed state with respect to the spin base 21 is set so that the center position of the substrate W intersects with the rotational axis of the spin base 21 when the substrate W is grasped by the grasping pins 60A, 60B, and 60C in step S6 described later. In this substrate processing example, the position of the positioning pins 50A, 50B, and 50C with respect to the spin base 21 does not change from here until immediately before the carry-out of the substrate W. In this substrate processing example, there is no need to displace the positioning pins 50A, 50B, and 50C with respect to the spin base 21, and therefore the apparatus may be arranged so as to exclude positioning-pin driving mechanisms 54A, 54B, and 54C. In this substrate processing example, the position of the positioning pins 50A, 50B, and 50C has already been in a closed state at the stage of step S1, and therefore a change does not occur in the position of the positioning pins 50A, 50B, and 50C in the process ranging from step S1 to step S2.

Step S4

Figure 4D:
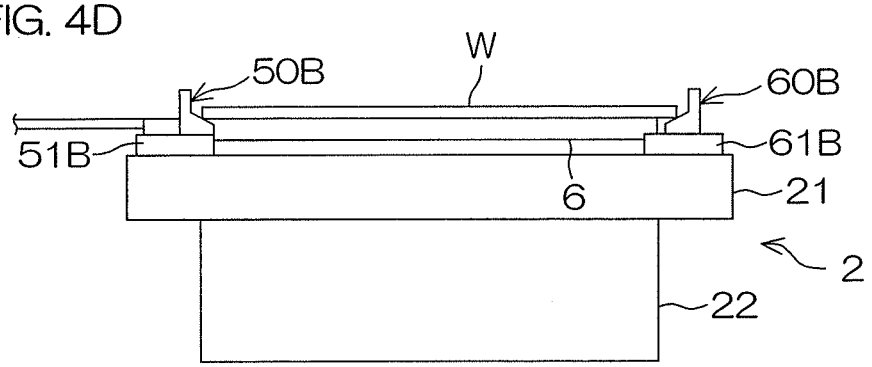
FIG. 4D is a view of the substrate processing apparatus to describe step S4 of the flowchart.

FIG. 4D is a side view of the spin chuck 2 to describe a relationship between the spin chuck 2 and a substrate W in step S4. In step S4, the substrate W is brought into contact with the positioning pins 50A, 50B, and 50C. In more detail, the control portion 70 controls the substrate transfer mechanism 5 to lower the hand mechanism 6, and, as a result, the peripheral edge (peripheral end surface) of the substrate W placed on the hand mechanism 6 is brought into contact with the guide portions 52A, 52B, and 52C of the positioning pins 50A, 50B, and 50C and with the guide portions 62A, 62B, and 62C of the grasping pins. This makes it possible to position the peripheral edge (peripheral end surface) of the substrate W (positioning step).

Step S5

Figure 4E:
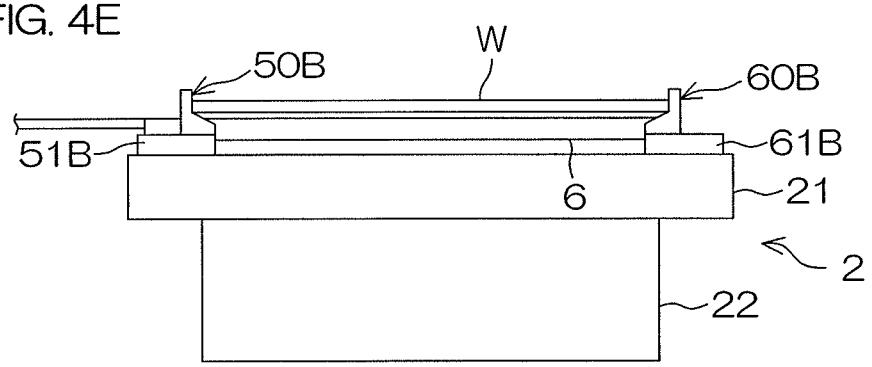
FIG. 4E is a view of the substrate processing apparatus to describe step S5 of the flowchart.

FIG. 4E is a side view of the spin chuck 2 to describe a relationship between the spin chuck 2 and a substrate W in step S5. In step S5, the grasping pins 60A, 60B, and 60C are all moved from an open state to a closed state. In other words, the grasping pins 60A, 60B, and 60C are all moved by a predetermined distance in the radial direction toward the center of the spin base 21. This movement allows the peripheral edge of the substrate W to move along the oblique surfaces of the guide portions 52A, 52B, and 52C of the positioning pins 50A, 50B, and 50C and the oblique surfaces of the guide portions 62A, 62B, and 62C of the grasping pins 60A, 60B, and 60C. This movement continues until the substrate W is butted against the contact portions 53A, 53B, and 53C of the positioning pins 50A, 50B, and 50C and against the contact portions 63A, 63B, and 63C of the grasping pins 60A, 60B, and 60C. As a result, the substrate W comes into a state of being sandwiched between the positioning pins 50A, 50B, 50C and the grasping pins 60A, 60B, 60C on the spin chuck 2.

Here, the positions on the spin base 21 in the closed state of the positioning pins 50A, 50B, and 50C are adjusted with the aim of correctly positioning the substrate W on the spin base 21. In other words, an adjustment is performed so that the center of the substrate W and the center of the spin base 21 coincide with each other in a state in which the circumferential surface portion (peripheral end surface) of the substrate W is in contact with the contact portions 53A, 53B, and 53C of the positioning pins 50A, 50B, and 50C. The positioning pins 50A, 50B, and 50C have this aim, and therefore, preferably, the relative position on the spin base 21 does not change in the closed state. In other words, preferably, the positioning pins 50A, 50B, and 50C have less so-called positional "clearance" on the spin base 21 in the closed state.

On the other hand, the relative position of the grasping pins 60A, 60B, and 60C with respect to the spin base 21 in the closed state is arranged to have slight positional "clearance" by including a spring mechanism and the like. At the point of time when step S5 is completed, it is preferable to bring the contact portions 63A, 63B, and 63C of the grasping pins 60A, 60B, and 60C into a state in which a predetermined tightening force in the radial direction toward the center of the spin chuck 2 is transmitted to the peripheral edge (peripheral end surface) of the substrate W. In other words, in the grasping pins 60A, 60B, and 60C, the position in the closed state is slightly closer to the center of the spin base 21 than in the positioning pins 50A, 50B, and 50C, and, from the viewpoint of a role fulfilled by the grasping pins 60A, 60B, and 60C, it is preferable to allow the grasping pins 60A, 60B, and 60C to have clearance so as to be slightly movable in the radial direction of the spin base 21 also in the closed state.

Step S6

Figure 4F:
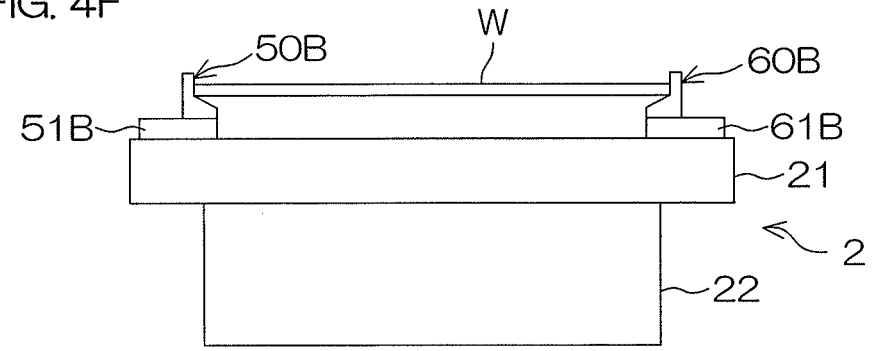
FIG. 4F is a view of the substrate processing apparatus to describe step S6 of the flowchart.

FIG. 4F is a side view of the spin chuck 2 to describe a relationship between the spin chuck 2 and a substrate W in step S6. In step S6, the control portion 70 controls the substrate transfer mechanism 5 to recede the hand mechanism 6 from the undersurface of the substrate W (transfer mechanism receding step). When the hand mechanism 6 recedes from the undersurface of the substrate W, the substrate W is brought into a state of being sandwiched between the positioning pins 50A, 50B, 50C and the grasping pins 60A, 60B, 60C above the spin base 21. Thereafter, the whole of the substrate transfer mechanism 5 including the hand mechanism 6 recedes from the processing chamber 10 through the shutter portion 11A on the chamber wall 11.

Step S7

Figure 4G:
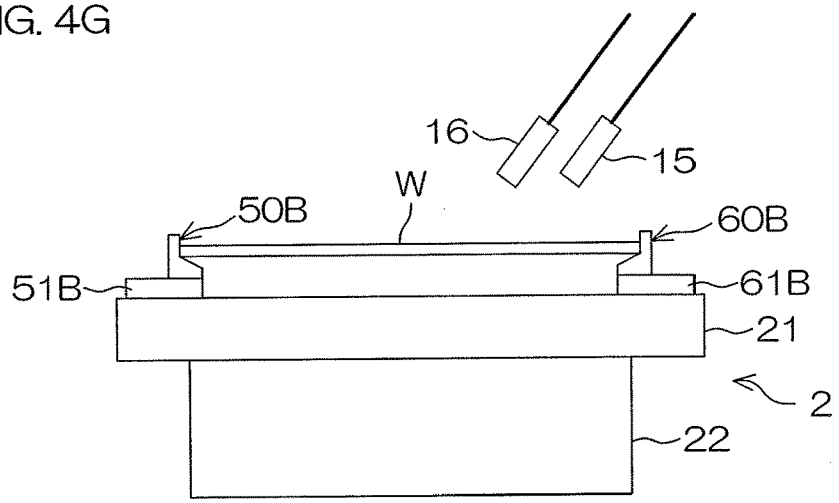
FIG. 4G is a view of the substrate processing apparatus to describe step S7 of the flowchart.

FIG. 4G is a side view of the spin chuck 2 to describe a relationship between the spin chuck 2 and a substrate W in step S7. In step S7, various substrate processing operations are applied to the substrate W in accordance with a recipe read by the control portion 70 from the storage portion 80. The etching, washing, drying, etc., of the substrate W are mentioned as examples of the substrate processing operations here. In substrate processing, based on the recipe, the control portion 70 allows the processing liquid nozzle 15 to discharge a predetermined processing liquid therefrom, and allows the gas nozzle 16 to discharge a predetermined processing gas therefrom, and allows the substrate W to rotate at a predetermined number of revolutions according to the recipe.

Next, a description will be given of steps (S8 to S11) in which, after the substrate W finishes being processed, the substrate W is delivered to the hand mechanism 6 of the substrate transfer mechanism 5 and is carried out from the processing chamber 10.

Step S8

Figure 4H:
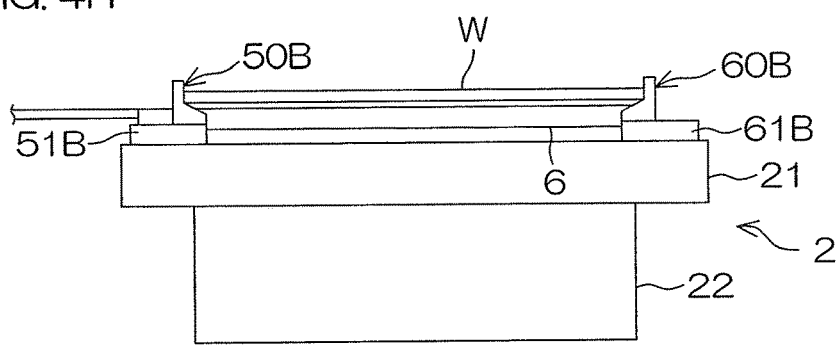
FIG. 4H is a view of the substrate processing apparatus to describe step S8 of the flowchart.

FIG. 4H is a side view of the spin chuck 2 to describe a relationship between the spin chuck 2 and a substrate W in step S8. In step S8, the control portion 70 controls the substrate transfer mechanism 5 to allow the hand mechanism 6 on which a substrate W is not placed to enter the processing chamber 10 through the shutter portion 11A on the chamber wall 11.

Thereafter, the control portion 70 controls the substrate transfer mechanism 5 to move the hand mechanism 6 to a predetermined position between the undersurface of the substrate W sandwiched between the positioning pins 50A, 50B, 50C and the grasping pins 60A, 60B, 60C and the upper surface of the spin base 21, and allows the hand mechanism 6 to rise to a position at which the upper surface of the hand mechanism 6 and the undersurface of the substrate W substantially come into contact with each other.

Step S9

Figure 4I:
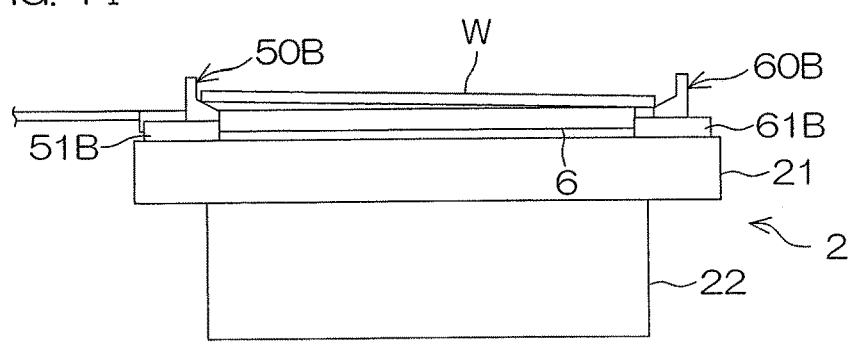
FIG. 4I is a view of the substrate processing apparatus to describe step S9 of the flowchart.

FIG. 4I is a side view of the spin chuck 2 to describe a relationship between the spin chuck 2 and a substrate W in step S9.

In step S9, the grasping pins 60A, 60B, and 60C are all brought into an open state. As a result, the substrate W moves downwardly, because of its own weight, along the guide portions 62A, 62B, and 62C of the grasping pins 60A, 60B, and 60C and along the guide portions 52A, 52B, and 52C of the positioning pins 50A, 50B, and 50C. As a result, the undersurface of the substrate W comes into contact with the upper surface of the hand mechanism 6. As a result, the undersurface of the substrate W is brought into a state of being supported by the upper surface of the hand mechanism 6 from below. This allows the substrate W to be delivered to the hand mechanism 6.

Step S10

Figure 4J:
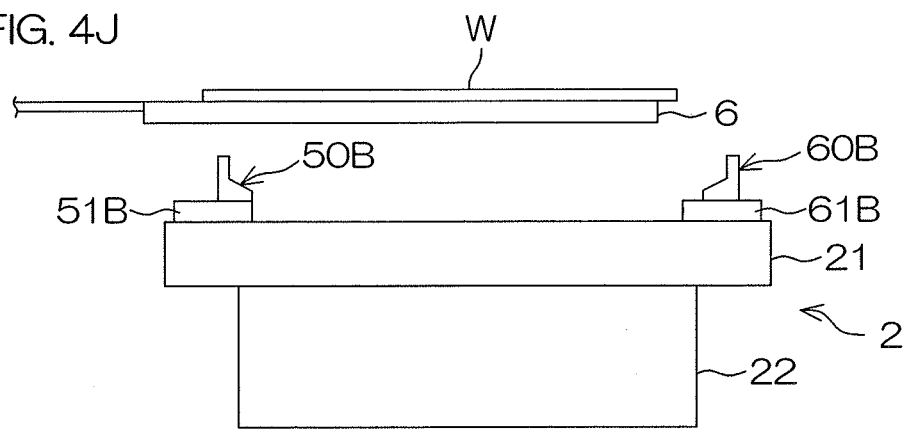
FIG. 4J is a view of the substrate processing apparatus to describe step S10 of the flowchart.

FIG. 4J is a side view of the spin chuck 2 to describe a relationship between the spin chuck 2 and a substrate W in step S10.

In step S10, the control portion 70 controls the substrate transfer mechanism 5 to move the hand mechanism 6 vertically and upwardly with respect to the spin chuck 2. This creates a state in which the undersurface of the substrate W breaks off contact with the positioning pins 50A, 50B, and 50C and with the grasping pins 60A, 60B, and 60C, and is supported only by the hand mechanism 6 from below. After the undersurface of the hand mechanism 6 is positioned higher than the positioning pins 50A, 50B, and 50C and than the grasping pins 60A, 60B, and 60C, the hand mechanism 6 recedes from above the spin base 21 while moving horizontally. Thereafter, the hand mechanism 6 delivers the substrate W placed thereon to the loader/unloader portion (not shown).

It is possible to embody the present invention in other modes although the preferred embodiment of the present invention has been described as above.

For example, in the preferred embodiment described above, the positioning pins 50A, 50B, and 50C and the grasping pins 60A, 60B, and 60C are arranged so as to create a closed state or an open state by moving in the radial direction of the spin base 21. However, besides this, a mode in which switching between the open state and the closed state is performed by switching the positioning pins 50A, 50B, and 50C and the grasping pins 60A, 60B, and 60C to a state standing in the vertical direction and to a state standing in the vertical diagonal direction or a mode in which switching between the open state and the closed state is performed by changing a state being in contact with the substrate W while allowing the positioning pins 50A, 50B, and 50C and the grasping pins 60A, 60B, and 60C to rotate on their axes may be employed as an arrangement to create the open state or the closed state.

Figure 6:
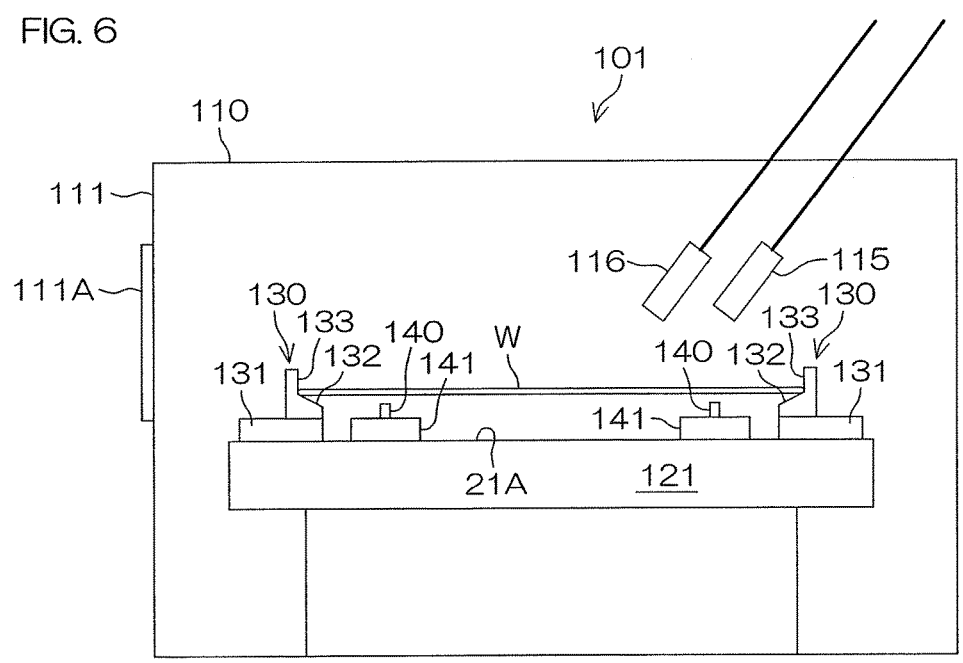
FIG. 6 is a schematic side view of a substrate processing apparatus according to other aspect.

FIG. 6 shows a schematic side view of a substrate processing apparatus 101 according to other aspect. The substrate processing apparatus 101 has a processing space surrounded by a chamber wall 111 having a shutter portion 111A that forwardly or backwardly moves a hand mechanism (not shown) of a substrate transfer mechanism (not shown). A spin chuck 102, a processing liquid nozzle 115 that supplies a processing liquid, a gas nozzle 116 that supplies a gas, etc., are contained in this containing space. The spin base 121 has a disk-shaped upper plate 121A. A plurality of chuck pins 130 are substantially equiangularly spaced at the peripheral edge of the upper plate 121A. Each of the chuck pins 130 is composed of a base portion 131 that is firmly disposed on the upper plate 121A of the spin base 121, a guide portion 132 that is connected to the upper part of the base portion 131 and that extends diagonally and vertically upwardly in the chuck pin 130, a contact portion 133 that is connected to the guide portion 132 and that is formed in a vertical shape, and a chuck pin driving mechanism (not shown) that allows the chuck pin 130 to perform switching between an open state and a closed state by moving the guide portion 132 and the contact portion 133 with respect to the base portion 131. A plurality of horizontal support pins 140 are spaced substantially equiangularly on the inner periphery side of the upper plate 121A. These horizontal support pins 140 are movable upwardly and downwardly in the vertical direction with respect to the upper plate 121A by means of a horizontal support pin driving mechanism 141.

Although the preferred embodiments of the present invention have been described in detail, these are merely specific examples used to clarify the technical contents of the present invention, and the present invention should not be interpreted by being limited to these specific examples, and the scope of the present invention is to be determined solely by the appended claims.

The present application corresponds to Japanese Patent Application No. 2015-066241 filed in the Japan Patent Office on Mar. 27, 2015 and Japanese Patent Application No. 2016-11694 filed in the Japan Patent Office on Jan. 25, 2016, and the entire disclosure of these applications is incorporated herein by reference.

The invention claimed is:

1. A substrate holding method for horizontally holding a substrate, the substrate holding method comprising,
   a placing step of placing a substrate on a substrate transfer mechanism;
   a first preparation step of bringing all of a plurality of openable and closable positioning pins into a closed state, the plurality of openable and closable positioning pins being disposed in a first area of a peripheral edge of an upper surface of a spin base along a circumferential direction thereof;
   a second preparation step of bringing all of a plurality of openable and closable grasping pins into an open state, the plurality of openable and closable grasping pins being disposed in a second area, which does not coincide with the first area, in the peripheral edge of the upper surface of the spin base along the circumferential direction thereof;
   a positioning step of positioning the substrate by moving the substrate transfer mechanism after completing the placing step, the first preparation step, and the second preparation step and by allowing the peripheral edge of the substrate to come into contact with all of the plurality of openable and closable positioning pins in the closed state thereof;
   a substrate grasping step of bringing all of the plurality of openable and closable grasping pins into a closed state after completing the positioning step so that the substrate held by all of the plurality of openable and closable positioning pins and the plurality of openable and closable grasping pins; and
   a transfer mechanism receding step of allowing the substrate transfer mechanism to recede from above the spin base after completing the substrate grasping step.

2. The substrate holding method according to claim 1, wherein the plurality of openable and closable positioning pins are disposed in the first area within a distribution angle of 180 degrees.

3. The substrate holding method according to claim 1, wherein the plurality of openable and closable positioning pins are kept in the closed state during the second preparation step, the positioning step, the substrate grasping step, and the transfer mechanism receding step.

4. A substrate processing apparatus for processing a substrate, the substrate processing apparatus comprising a substrate holding/rotating device that is configured to horizontally hold and rotate a substrate, and a substrate transfer mechanism that is configured to transfer the substrate,
   the substrate holding/rotating device comprising:
   a spin base that is rotatable on a rotational axis;
   a rotation driving mechanism that rotates the spin base;
   a plurality of openable and closable positioning pins disposed in a first area of a peripheral edge of an upper surface of the spin base along a circumferential direction thereof;
   a plurality of openable and closable grasping pins disposed in a second area, which does not coincide with the first area, of the peripheral edge of the upper surface of the spin base along the circumferential direction thereof;
   a positioning pin opening/closing mechanism that causes all of the plurality of openable and closable positioning pins to perform switching between a closed state and an open state;
   a grasping pin opening/closing mechanism that causes all of the plurality of openable and closable grasping pins to perform switching between a closed state and an open state; and
   a control unit that controls an operation of the substrate transfer mechanism, an operation of the rotation driving mechanism, an operation of the positioning pin opening/closing mechanism, and an operation of the grasping pin opening/closing mechanism.

5. The substrate processing apparatus according to claim 4, wherein the plurality of openable and closable positioning pins are disposed in the first area within a distribution angle of 180 degrees.

6. The substrate processing apparatus according to claim 4, wherein the plurality of openable and closable positioning pins are kept in the closed state.

7. The substrate processing apparatus according to claim 4, wherein the control unit is a computer which is configured and programmed to control the operations of the transfer, driving and opening/closing mechanisms, to perform:
   a placing step of placing a substrate on the substrate transfer mechanism;
   a first preparation step of bringing the plurality of openable and closable positioning pins into the closed state thereof;
   a second preparation step of bringing the plurality of openable and closable grasping pins into the open state thereof;

a positioning step of positioning the substrate by moving the substrate transfer mechanism after completing the placing step, the first preparation step, and the second preparation step and by allowing the peripheral edge of the substrate to come into contact with the plurality of openable and closable positioning pins in the closed state thereof;

a substrate grasping step of bringing the plurality of openable and closable grasping pins into the closed state thereof after completing the positioning step so that the substrate held by the plurality of openable and closable positioning pins and the plurality of openable and closable grasping pins; and a transfer mechanism receding step of allowing the substrate transfer mechanism to recede from above the spin base after completing the substrate grasping step.

* * * * *